(12) United States Patent
Cohen

(10) Patent No.: US 11,817,841 B2
(45) Date of Patent: Nov. 14, 2023

(54) ADAPTIVE CAPACITIVE FILTER CIRCUIT

(71) Applicant: Texas Instruments Incorporated, Dallas, TX (US)

(72) Inventor: Isaac Cohen, Dix Hills, NY (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/573,579

(22) Filed: Jan. 11, 2022

(65) Prior Publication Data

US 2022/0224314 A1 Jul. 14, 2022

Related U.S. Application Data

(60) Provisional application No. 63/136,267, filed on Jan. 12, 2021.

(51) Int. Cl.
| | |
|---|---|
| *H03H 19/00* | (2006.01) |
| *H02M 3/156* | (2006.01) |
| *G01R 19/165* | (2006.01) |
| *H02M 1/15* | (2006.01) |
| *H03H 11/04* | (2006.01) |
| *H03K 5/24* | (2006.01) |

(52) U.S. Cl.
CPC ..... *H03H 19/004* (2013.01); *G01R 19/16538* (2013.01); *H02M 1/15* (2013.01); *H02M 3/156* (2013.01); *H03H 11/04* (2013.01); *H03H 19/002* (2013.01); *H03K 5/24* (2013.01)

(58) Field of Classification Search
CPC .......... H02M 1/15; H02M 1/10; H02M 3/156; H02M 7/04; H02M 1/32; H02M 1/14; H03K 5/24; G01R 19/16538; H03H 11/04; H03H 19/002; H03H 19/004
See application file for complete search history.

(56) References Cited

U.S. PATENT DOCUMENTS

| | | | | |
|---|---|---|---|---|
| 9,583,174 | B1 * | 2/2017 | Kim | G11C 11/4091 |
| 10,033,269 | B2 * | 7/2018 | Leong | H02M 7/06 |
| 2017/0294831 | A1 * | 10/2017 | Dai | G05F 5/00 |
| 2020/0136494 | A1 * | 4/2020 | Kazama | H02M 3/158 |
| 2021/0234471 | A1 * | 7/2021 | Qiu | H02M 7/062 |
| 2022/0311331 | A1 * | 9/2022 | Li | H02M 7/06 |

\* cited by examiner

*Primary Examiner* — Quan Tra
(74) *Attorney, Agent, or Firm* — Charles F. Koch; Frank D. Cimino

(57) ABSTRACT

An adaptive capacitive filter circuit includes: a first terminal adapted to be coupled to a rectifier bridge output; a second terminal adapted to be coupled to a ground terminal; a first capacitor having a first electrode and a second electrode, the first electrode of the first capacitor coupled to the first terminal; a second capacitor having a first electrode and a second electrode, the second electrode of the second capacitor coupled to the second terminal; a first switch coupled between the second electrode of the first capacitor and the second terminal; a second switch coupled between the first terminal and the first electrode of the second capacitor; and a third switch coupled between the second electrode of the first capacitor and the first electrode of the second capacitor.

18 Claims, 5 Drawing Sheets

ADAPTIVE CAPACITIVE FILTER CIRCUIT

CROSS-REFERENCE TO RELATED APPLICATION

This application claims priority to U.S. Provisional Application No. 63/136,267, filed Jan. 12, 2021, which is hereby incorporated by reference.

BACKGROUND

As new electronic devices are developed and integrated circuit (IC) technology advances, new IC products are commercialized. One example IC product includes switches or switch control circuitry related to power management. FIG. 1 is a diagram of a conventional power management system 100 having an alternating-current (AC) source 102, a rectifier bridge 104, and a capacitive filter 108. As shown, the rectifier bridge 104 is coupled to the AC source 102 and includes a rectifier bridge output 106. In operation, the rectifier bridge 104 is configured to rectify an input voltage (VIN) from the AC source 102, resulting in an output voltage (VOUT) at the rectifier bridge output 106. VOUT is provided to a load (not shown). In the example of FIG. 1, the capacitive filter 108 is configured to support two different VIN levels (e.g., 120V and 240V). As shown, the capacitive filter 108 includes a first capacitor (C1) and a second capacitor (C2). C2 has a first electrode coupled to the rectifier bridge output 106 and a second electrode coupled to ground. C1 has a first electrode coupled to the rectifier bridge output 106 and a second electrode coupled to ground via a switch (Q1). Q1 is controlled by the output of a comparator 110, which is configured to compare VOUT (proportional to VIN) with a reference voltage (VREF) provided by a voltage source 112. When VOUT is greater than VREF (e.g., above 190V), Q1 is open, C1 is disconnected, and C2 (e.g., rated for 400V) is the only filter capacitor connected. When VOUT is not greater than VREF (e.g., not greater than 190V), Q1 is closed, and C1 (e.g., rated for 200V) is connected in parallel with C2.

With the capacitive filter 108, the power management system 100 has various shortcomings. Firstly, a short to Q1 results in a hazardous overvoltage condition on C1. Secondly, Q1 needs to withstand the peak VIN. Also, the minimum value of C2 may be limited by the root r mean square (RMS) current rating rather than the energy storage requirements.

SUMMARY

In one example embodiment, an adaptive capacitive filter circuit includes: a first adaptive capacitive filter circuit terminal adapted to be coupled to a rectifier bridge output; a second adaptive capacitive filter circuit terminal adapted to be coupled to ground; a first capacitor having a first electrode and a second electrode, the first electrode of the first capacitor coupled to the first adaptive capacitive filter circuit terminal; a second capacitor having a first electrode and a second electrode, the second electrode of the second capacitor coupled to the second adaptive capacitive filter circuit terminal; a first switch coupled between the second electrode of the first capacitor and the second adaptive capacitive filter circuit terminal; a second switch coupled between the first adaptive capacitive filter circuit terminal and the first electrode of the second capacitor; and a third switch coupled between the second electrode of the first capacitor and the first electrode of the second capacitor.

In another example embodiment, an integrated circuit includes control circuitry for an adaptive capacitive filter circuit. The control circuitry is configured to: detect whether an output voltage at a rectifier bridge output is greater than a threshold; responsive to detecting that the output voltage is greater than the threshold, provide a first set of switch drive signals for switches of the adaptive capacitive filter circuit to couple capacitors of the adaptive capacitive filter circuit in series; and responsive to detecting that the output voltage is not greater than the threshold, provide a second set of switch drive signals for switches of the adaptive capacitive filter circuit to couple the capacitors of the adaptive capacitive filter circuit in parallel.

In yet another example embodiment, a system includes an adaptive capacitive filter circuit having: a set of capacitors; a first adaptive capacitive filter circuit terminal adapted to be coupled to a rectifier bridge output; and a second adaptive capacitive filter circuit terminal adapted to be coupled to ground. The adaptive capacitive filter circuit is configured to connect capacitors of the set of capacitors in series or in parallel between the first adaptive capacitive filter circuit terminal and the second adaptive capacitive filter circuit terminal responsive to a control signal.

DETAILED DESCRIPTION

Figure 2:
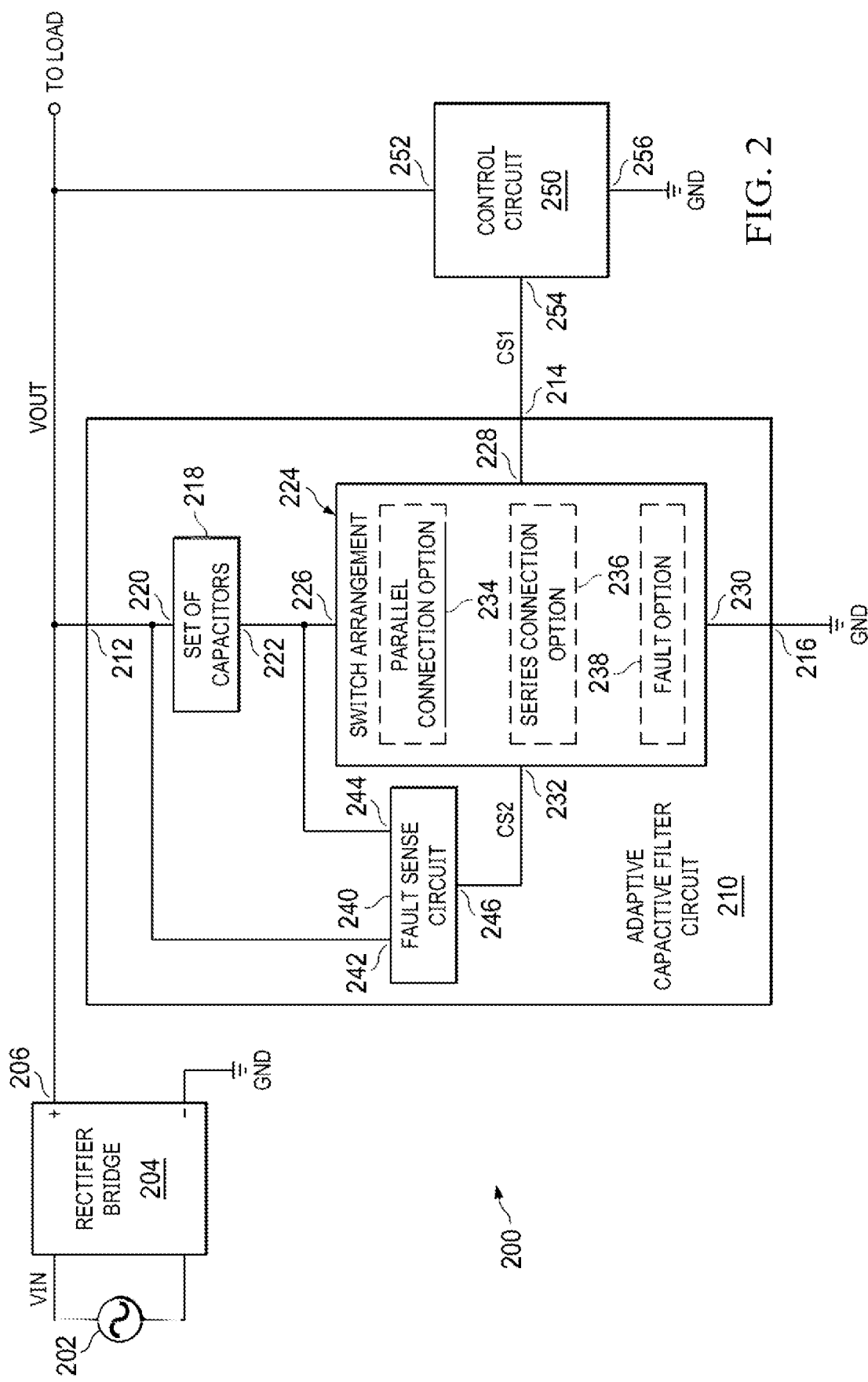
FIG. 2 is a diagram of a power management system having an adaptive capacitive filter circuit in accordance with an example embodiment.

The same reference numbers (or other reference designators) are used in the drawings to designate the same or similar (structurally and/or functionally) features. FIG. 2 is a diagram of a power management system 200 having an adaptive capacitive filter circuit 210 in accordance with an example embodiment. As shown, the power management system 200 includes an alternating-current (AC) source 202 coupled to a rectifier bridge 204 having a rectifier bridge output 206. In operation, the rectifier bridge 204 is configured to rectify an input voltage (VIN) from the AC source 202, resulting in an output voltage (VOUT) at the rectifier bridge output 206, where VOUT is smoothed by the adaptive capacitive filter circuit 210. In the example of FIG. 2, the rectifier bridge output 206 is adapted to be coupled to a load, the adaptive capacitive filter circuit 210, and a control circuit 250 for the adaptive capacitive filter circuit 210. In operation, the adaptive capacitive filter circuit 210 and the control circuit 250 are configured to adjust a capacitive filter value at the rectifier bridge output 206 to account for two or more possible VIN levels (e.g., 120V and 240V) from the AC source 202 while protecting against possible fault conditions. In some example embodiments, the control circuit 250 is part of the adaptive capacitive filter circuit 210 rather than separate from and coupled to the adaptive capacitive filter circuit 210.

In the example of FIG. 2, the adaptive capacitive filter circuit 210 includes a first adaptive capacitive filter circuit terminal 212, a second adaptive capacitive filter circuit terminal 214, and a third adaptive capacitive filter circuit terminal 216. The first adaptive capacitive filter circuit terminal 212 is coupled to the rectifier bridge output 206 and is configured to receive VOUT. The second adaptive capacitive filter circuit terminal 214 is coupled to a control circuit output 254 of the control circuit 250 and is configured to receive a control signal (CS1) that indicates whether VOUT is greater than a threshold. The third adaptive capacitive filter circuit terminal 216 is coupled to ground. As shown, the control circuit 250 includes a control circuit input 252, the control circuit output 254, and a control circuit terminal 256. The control circuit input 252 is coupled to the rectifier bridge output 206 and is configured to receive VOUT. The control circuit terminal 256 is coupled to ground. In operation, the control circuit 250 is configured to provide CS1 at the control circuit output 254 responsive to a comparison of VOUT with a threshold (e.g., the value of CS1 varies depending on whether VOUT is greater than the threshold).

As shown, the adaptive capacitive filter circuit 210 includes a set of capacitors 218 having a first set of capacitors terminal 220 and a second set of capacitors terminal 222. The first set of capacitors terminal 220 is coupled to the first adaptive capacitive filter circuit terminal 212. The second set of capacitors terminal 222 is coupled to the switch arrangement 224. The switch arrangement 224 includes a first switch arrangement terminal 226, a second switch arrangement terminal 228, a third switch arrangement terminal 230, and a fourth switch arrangement terminal 232. The first switch arrangement terminal 226 is coupled to the second set of capacitors terminal 222. The second switch arrangement terminal 228 is coupled to the control circuit output 254. The third switch arrangement terminal 230 is coupled to ground via the third adaptive capacitive filter circuit terminal 216. The fourth switch arrangement terminal 232 is coupled to a fault sense circuit 240.

In the example of FIG. 2, the fault sense circuit 240 includes a first fault sense circuit input 242, a second fault sense circuit input 244, and a fault sense circuit output 246. The first fault sense circuit input 242 is coupled to the first set of capacitors terminal 220. The second fault sense circuit input 244 is coupled to the second set of capacitors terminal 222. The fault sense circuit output 246 is coupled to the fourth switch arrangement terminal 232. In operation, the fault sense circuit 240 is configured to provide a control signal (CS2) at the fault sense circuit output 246 responsive to sense signals received at the first fault sense circuit input 242 and the second fault sense circuit input 244. In different example embodiments, the fault sense circuit 240 may include respective inputs to sense faults for any capacitor of the set of capacitors 218 and/or any switch of the switch arrangement 224.

As described above, the control circuit 250 is configured to provide CS1 at the control circuit output 254 based on a comparison of VOUT with a threshold. Responsive to CS1, the switch arrangement 224 is configured to provide a parallel connection option 234 for capacitors of the set of capacitors 218 or a series connection option 236 for capacitors of the set of capacitors 218. In some example embodiments, if VOUT is above the threshold, CS1 directs the switch arrangement 224 to use the series connection option 236 for capacitors of the set of capacitors 218. If VOUT is not above the threshold, CS1 directs the switch arrangement 224 to use the parallel connection option 234 for capacitors of the set of capacitors 218. Without limitation, the set of capacitors 212 includes a first capacitor and a second capacitors that are coupled in series or in parallel based on the switch arrangement 214 and responsive to CS1.

With the fault sense circuit 240, a fault condition (e.g., a capacitor fault and/or a switch fault) related to the adaptive capacitive filter circuit 210 may be detected. Responsive to a detected fault condition, the fault sense circuit 240 is configured to provide CS2 to the fourth switch arrangement terminal 232 of the switch arrangement 224. Responsive to CS2, the switch arrangement 224 is configured to use a fault option 238 for switches of the switch arrangement 224. In some example embodiments, the fault option 238 assumes switches of the switch arrangement 224 will fault to a short circuit rather than an open circuit. In some example embodiments, the fault option 238 provides a path to ground (e.g., by connecting the first adaptive capacitive filter circuit terminal 212 to the third adaptive capacitive filter circuit 216 via switches of the switch arrangement 224) so that a fuse will trigger responsive to the detected fault condition. Without limitation, the fuse (not shown) may be between the AC source 202 and the rectifier bridge 204. In some example embodiments, the switch arrangement 224 includes control logic (e.g., the control logic 320 in FIGS. 3 and 4) configured to receive CS1 and CS2 and provide switch control signals responsive to CS1 and CS2. When CS2 indicates a fault condition, CS2 has priority over CS1.

Together, the control circuit 250, the fault sense circuit 240, and such control logic form the control circuitry for the adaptive capacitive filter circuit 210. In different example embodiments, the control circuitry for the adaptive capacitive filter circuit 210 may be part of one integrated circuit (IC) or multiple ICs. As another option, the switch arrangement 224 may be included with the same IC as the control circuitry. As another option, the set of capacitors 218 may be separate from the IC or ICs having the control circuitry and the switch arrangement 224.

Figure 1:
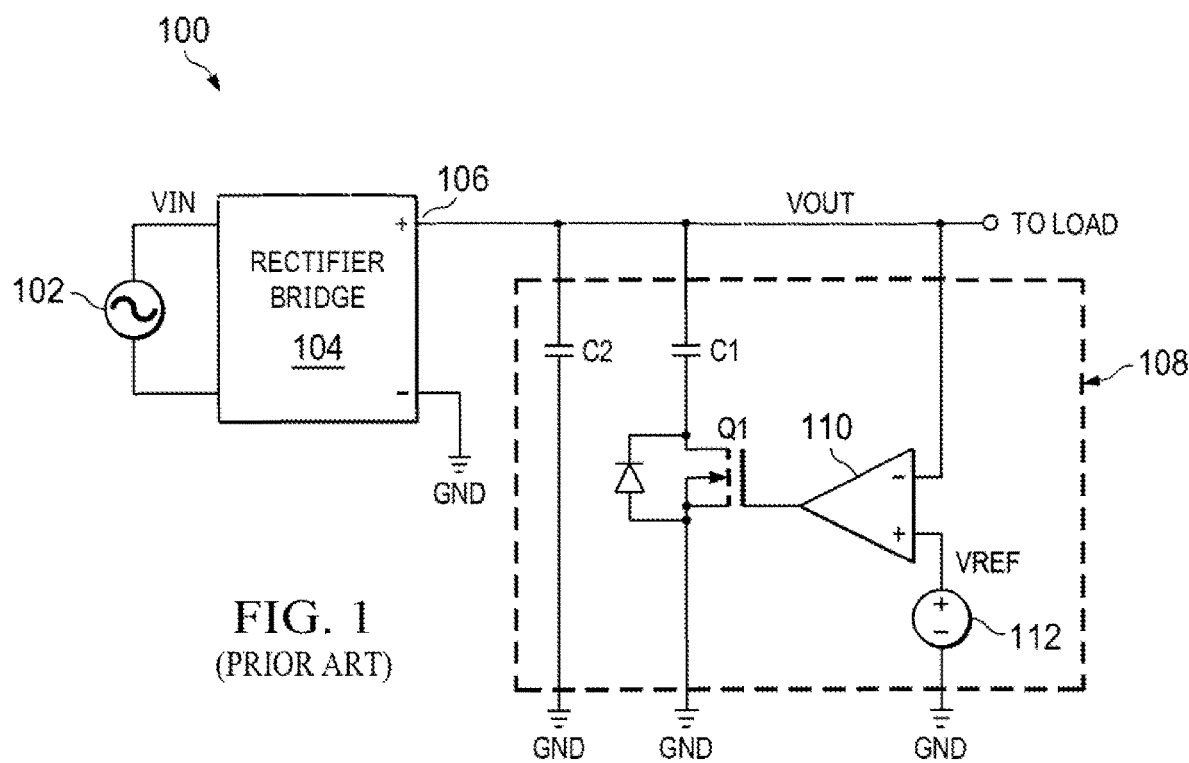
FIG. 1 is a diagram of a conventional power management system having a capacitive filter.

With the adaptive capacitive filter circuit 210 and the control circuit 250, different VIN levels from the AC source 202 are supported while reducing the shortcomings of the conventional approach of FIG. 1. Some benefits of the adaptive capacitive filter circuit 210 relative to the conventional approach of FIG. 1 include accounting for fault conditions and using capacitors with smaller ratings. Compared to Q1 in FIG. 1, the switches of the switch arrangement 224 have smaller ratings and are physically smaller.

Figure 3:
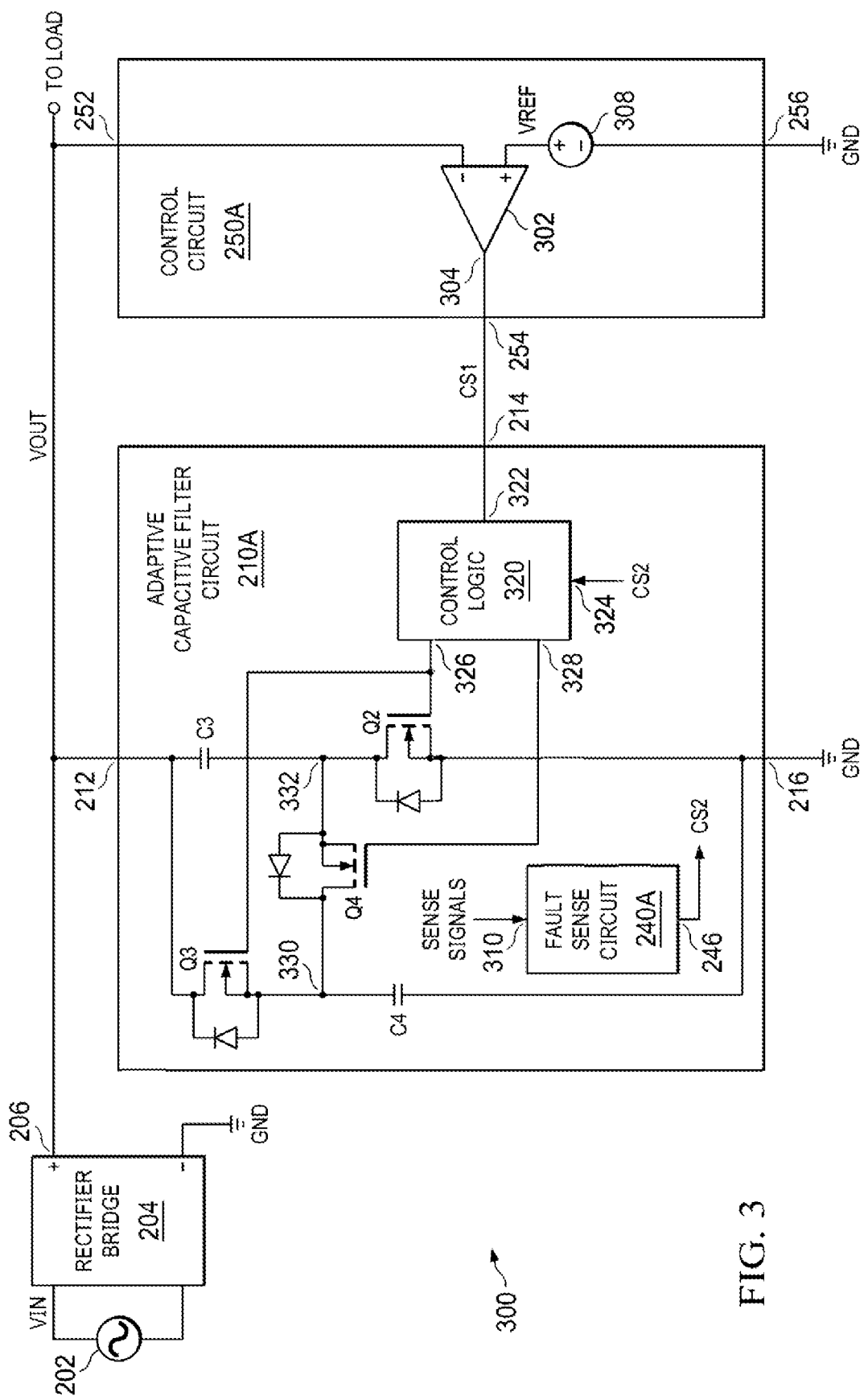
FIG. 3 is a diagram of another power management system having an adaptive capacitive filter circuit in accordance with an example embodiment.

FIG. 3 is a diagram of another power management system 300 having an adaptive capacitive filter circuit 210A (an example of the adaptive capacitive filter circuit 210 in FIG. 2) in accordance with an example embodiment. As shown, the power management system 300 includes the AC source 202 coupled to the rectifier bridge 204. The rectifier bridge output 206 of the rectifier bridge 204 is coupled to the adaptive capacitive filter circuit 210A and a control circuit 250A (an example of the control circuit 250 in FIG. 1). In the example of FIG. 3, the rectifier bridge output 206 is adapted to be coupled to load (not shown). In operation, the rectifier bridge 204 is configured to rectify VIN from the AC source 202, resulting in VOUT at the rectifier bridge output 206, where VOUT is a smoothed by the adaptive capacitive filter circuit 210A. In operation, the adaptive capacitive filter circuit 210A and the control circuit 250A are configured to adjust a capacitive filter value at the rectifier bridge output 206 to account for two VIN levels (e.g., 120V and 240V) while protecting against possible fault conditions. In some example embodiments, the control circuit 250A is part of the adaptive capacitive filter circuit 210A rather than coupled to the adaptive capacitive filter circuit 210A.

In the example of FIG. 3, the adaptive capacitive filter circuit 210A includes the first adaptive capacitive filter circuit terminal 212, the second adaptive capacitive filter circuit terminal 214, and the third adaptive capacitive filter circuit terminal 216. Again, the first adaptive capacitive filter circuit terminal 212 is coupled to the rectifier bridge output 206 and is configured to receive VOUT. The second adaptive capacitive filter circuit terminal 214 is coupled to the control circuit output 254 of the control circuit 250A and is configured to receive CS1. The third adaptive capacitive filter circuit terminal 216 is coupled to ground.

In the example of FIG. 3, the adaptive capacitive filter circuit 210A includes capacitors C3 and C4 (an example of the set of capacitors 218 in FIG. 2). The adaptive capacitive filter circuit 210A also includes transistors Q2, Q3, and Q4 (e.g., switches of the switch arrangement 224 in FIG. 2). The adaptive capacitive filter circuit 210A also includes a fault sense circuit 240A (an example of the fault sense circuit 240 in FIG. 2) and control logic 320.

As shown, a first electrode of C3 is coupled to the first adaptive capacitive filter circuit terminal 212. A second electrode of C3 is coupled to ground via Q2. Specifically, a first current terminal of Q2 is coupled to the second electrode of C3, and a second current terminal of Q2 is coupled to ground. Also, a first electrode of C4 is coupled to the first adaptive capacitive filter circuit terminal 212 via Q3. Specifically, a first current terminal of Q3 is coupled to the first adaptive capacitive filter circuit terminal 212, and a second current terminal of Q3 is coupled to the first electrode of C4. A second electrode of C4 is coupled to ground. The first electrode of C4 is also coupled to the second electrode of C3 via Q4. Specifically, a first current terminal of Q4 is coupled to the second electrode of C3, and the second current terminal of Q4 is coupled to the first electrode of C4. With the switch arrangement of FIGS. 3, C3 and C4 can be connected in parallel, connected in series, or bypassed.

In the example of FIG. 3, the control of Q2, Q3, and Q4 is based on the operations of the control circuit 250A, the fault sense circuit 240A, and the control logic 320. As shown, the control circuit 250A includes a comparator 302 having an inverting input, a non-inverting input, and a comparator output 304. The inverting input of the comparator 302 is coupled to the control circuit input 252 and is configured to receive VOUT (proportional to VIN). The non-inverting input of the comparator 302 is coupled to a voltage source 308 and is configured to receive reference voltage (VREF) from the voltage source 308 (i.e., VREF is a threshold). Specifically, a first side of the voltage source 308 is coupled to the non-inverting input of the comparator 302, and a second side of the voltage source 308 is coupled to ground via the control circuit terminal 256. In operation, the comparator 302 is configured to adjust CS1 at the comparator output 304 based on a comparison of VOUT with VREF.

In the example of FIG. 3, the fault sense circuit 240A includes fault sense circuit inputs 310 configured to receive sense signals. The sense signals indicate, for example, the voltage across C3, the voltage across C4, the voltage across Q3, the voltage across Q4, the voltage across Q5, and/or other sense signals. As another option, current sense signals could indicate a fault condition. Responsive to the sense signals, particular thresholds, and comparison operations, the faults sense circuit 240A is configured to adjust CS2 at the fault sense circuit output 246 to indicate whether there are any faults.

As shown, CS1 and CS2 are provided to the control logic 320 as inputs. More specifically, the control logic 320 includes a first control logic input 322, a second control logic input 324, a first control logic output 326, and a second control logic output 328. The first control logic input 322 is configured to receive CS1. The second control logic input 324 is configured to receive CS2. The first control logic output 326 is coupled to the control terminals of Q2 and Q3. The second control logic output 328 is coupled to the control terminal of Q4. In operation, the control logic 320 is configured to provide switch control signals for Q2, Q3, and Q4 response to CS1 and CS2. In some example embodiments, if CS1 is a first value (indicating VOUT is greater than VREF), the control logic 320 is configured to provide switch control signals so that C3 and C4 are in series (i.e., Q2 and Q3 off, and Q4 on) between the first adaptive capacitive filter circuit terminal 212 and ground. If CS1 is a second value (indicating VOUT is not greater than VREF), the control logic 320 is configured to provide switch control signals so that C3 and C4 are in parallel (i.e., Q2 and Q3 on, and Q4 off) between the first adaptive capacitive filter circuit terminal 212 and ground. If CS2 indicates a fault condition, the control logic 320 is configured to provide switch control signals so that C3 and C4 are bypassed such that the first adaptive capacitive filter circuit terminal 212 is coupled to ground via Q2, Q3, and Q4 (i.e., Q2, Q3, and Q4 on or shorted). When CS2 indicates a fault condition, CS2 has priority over CS1. In some example embodiments, the number of voltage levels supported, the number of capacitors, and the number of switches may vary from the example of FIG. 3

Together, the control circuit 250A, the fault sense circuit 240A, and the control logic 320 form the control circuitry for the adaptive capacitive filter circuit 210A. In different example embodiments, the control circuitry for the adaptive capacitive filter circuit 210A may be part of one IC or multiple ICs. As another option, Q2, Q3, and Q4 may be included with the same IC as the control circuitry. As another option, C3 and C4 may be separate from the IC or ICs having the control circuitry and Q2, Q3, and Q4.

In the example of FIG. 3, the adaptive capacitive filter circuit 210A includes a first terminal 330 and a second terminal 332. The first terminal 330 is between the second current terminal of Q3, the second current terminal of Q4, and the first electrode of C4. The second terminal 332 is between the second electrode of C3, the first current terminal of Q2 and the first current terminal of Q4. If C3 and C4 are external to the IC having the control circuitry and Q2, Q3, and Q4, the IC may include external terminals or pins related to the first terminal 330 and the second terminal 332 of the adaptive capacitive filter circuit 210A to facilitate coupling C3 and C4 to the other components as shown in FIG. 3. The IC may also include external terminals or pins related to the first adaptive capacitive filter circuit terminal 212, and the third adaptive capacitive filter circuit terminal 216. In some example embodiments, the control circuit 250A is internal to the IC having the control logic 320. In such case, the second adaptive capacitive filter circuit terminal 214 is an internal terminal of the IC rather than an external terminal or pin.

In some example embodiments of the adaptive capacitive filter circuit 210A, all switches (Q2, Q3, and Q4) may be initially off (i.e., a cold start). After an input voltage (e.g., VIN from the AC source 202) is applied, C3 and C4 charge in series through the body diode of Q4 to a voltage that is approximately equal to one half the peak input voltage. Consequently, all the switches are exposed to a voltage not higher than half the input voltage. Relative to transistor (e.g., Q1) of the conventional approach of FIG. 1, the transistors of the adaptive capacitive filter circuit (e.g., Q2, Q3, and Q4)

will be rated to a voltage that is half that of Q1. The result is a substantial decrease in the specific on-resistance (Rsp) and relative size of Q2, Q3, and Q4 relative to Q1.

In some example embodiments of the adaptive capacitive filter circuit, C3 and C4 are rated for half the peak input voltage. With a lower rating for C3 and C4, a substantially higher root mean square (RMS) current capability exists relative to C1 and C2 in the conventional approach. Also, capacitance of the adaptive capacitive filter circuit is constrained by energy storage requirements rather than RMS current.

In some example embodiments, failure of either Q2 or Q3 results in overvoltage on capacitors C3 or C4. Capacitor failure of C3 or C4 may result in a fault current that may not be high enough to clear the input fuse resulting in catastrophic venting/fire risk. To avoid this outcome, the voltage across C1 and C2 may be sensed. If the sense voltage exceeds a particular value, all switches (e.g., Q2, Q3, and Q4 in FIG. 3) are turned on simultaneously, thereby "crowbarring" the output of the bridge rectifier and creating a fault current sufficient to clear the input fuse. As another option, the voltage across Q2, Q3, or Q4 may be sensed to detect a fault condition.

With the adaptive capacitive filter circuit 210A and the control circuit 250A, different VIN levels from the AC source 202 are supported while reducing the shortcomings of the conventional approach of FIG. 1. Some benefits of the adaptive capacitive filter circuit 210A relative to the conventional approach of FIG. 1 include accounting for fault conditions and using capacitors with smaller ratings. Compared to Q1 in FIG. 1, Q2, Q3, and Q4 in FIG. 3 have smaller ratings and are physically smaller.

Figure 4:
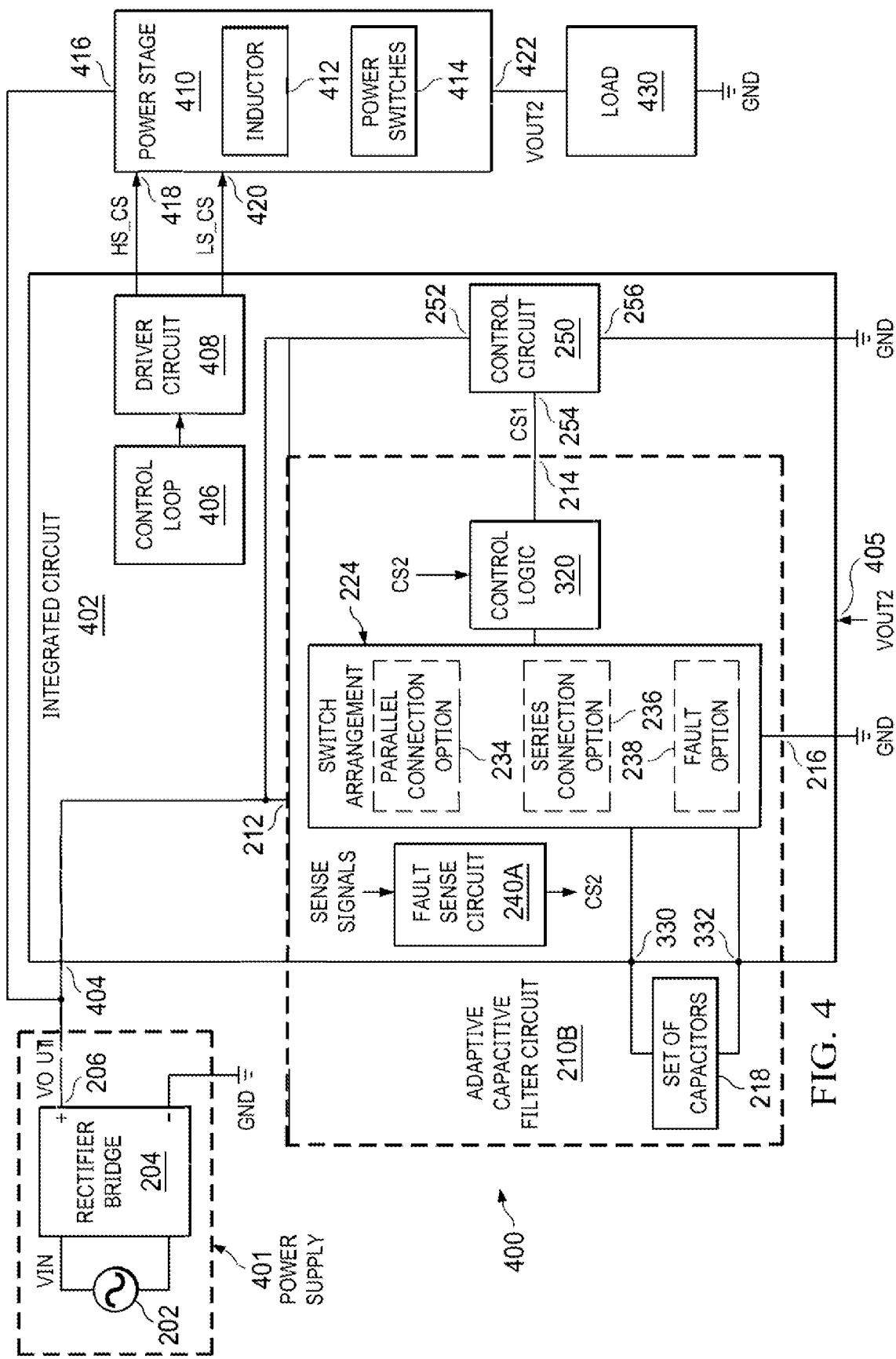
FIG. 4 is a diagram of a system having an adaptive capacitive filter circuit in accordance with an example embodiment.

FIG. 4 is a diagram of a system 400 having an adaptive capacitive filter circuit 210B in accordance with an example embodiment. The system 400 represents any electrical device having a load 430 and power management circuitry including: a power supply 401; the adaptive capacitive filter circuit 210B; a power stage 410; and switching converter controller components for the power stage 410. In the example of FIG. 4, the control circuitry (e.g., the control circuit 250, the control logic 320, and the fault sense circuit 240A) and the switch arrangement 224 of the adaptive capacitive filter circuit 210B are part of an IC 402. Meanwhile, the set of capacitors 218 of the adaptive capacitive filter circuit 210B are external to the IC 402. In other example embodiments, control circuitry and the switch arrangement 224 of the adaptive capacitive filter circuit 210B may be part of multiple ICs.

As shown, the power supply 401 includes the AC source 202 coupled to the rectifier bridge 204. In the system 400, the rectifier bridge output 206 of the rectifier bridge 204 is coupled to: an IC input 404 of the IC 402; and a power stage input 416 of a power stage 410. In operation, the rectifier bridge 204 is configured to rectify VIN from the AC source 202, resulting in an output voltage (VOUT1) at the rectifier bridge output 206, where VOUT1 is a smoothed by the adaptive capacitive filter circuit 210B.

In the example of FIG. 4, the IC 402 includes a switching converter controller components to control power switches 414 of the power stage 410. Example switching converter controller components that may be included with the IC 402 include a control loop 406 and a driver circuit 408. In operation, the control loop 406 and the driver circuit 408 are configured to power switch drive signals, such as a high-side control signal (HS_CS) and a low-side control signal (LS_CS), to the power stage 410. As shown, the power stage 410 includes the power stage input 416, a first drive signal input 418, a second drive signal input 420, a power stage output 422, an inductor 412, and the power switches 414. Using the control loop 406 and the driver circuit 408, the IC 402 is configured to provide power switch drive signals (e.g., HS_CS and LS_CS) to the power switches 414 via the first drive signal input 418 and the second drive signal input 420. The power switch drive signals control the on/off state of the power switches 414 to regulate current in the inductor 412 and maintain a target output voltage (VOUT2) while powering the load 430. Over time, the demand of the load 430 may change. Example control options managed by the control loop 406 to adjust the power switch drive signals include determining feedback error between VOUT2 and a reference voltage, performing pulse-width modulation (PWM) responsive to the feedback error, performing pulse-frequency modulation (PFM) responsive to the feedback error, performing zero crossing detection, performing multi-phase control, and/or other control options.

Using the control circuitry (e.g., the control circuit 250, the control logic 320, and the fault sense circuit 240A) and the switch arrangement 224, the IC 402 is configured to controls whether the capacitors of the set of capacitors 218 are coupled in series, in parallel, or bypassed as described herein. To enable the switch arrangement 224 to be coupled to the capacitors of the set of capacitors 218, the IC 402 also include external terminals or pins 330 and 332 (corresponding to first and second terminals 330 and 332 in FIG. 3).

In some example embodiments, the IC 402 is configured to: connect the capacitors of the set of capacitors 218 in series using the switch arrangement 224 (e.g., responsive to CS1 indicating VOUT1 is greater than the threshold); connect the capacitors of the set of capacitors 218 in parallel using the switch arrangement 224 (e.g., responsive to CS1 indicating VOUT1 is not greater than the threshold); or bypass the capacitors of the set of capacitors 218 using the switch arrangement 224 (e.g., connect the first adaptive capacitive filter circuit terminal 212 to ground responsive to CS2 indicating a fault condition).

With the adaptive capacitive filter circuit 210B and related components of the IC 402, different VIN levels from the AC source 202 (e.g., 120V and 240V) are supported while reducing the shortcomings of the conventional approach of FIG. 1. Some benefits of the adaptive capacitive filter circuit 210B relative to the conventional approach of FIG. 1 include accounting for fault conditions and using capacitors having smaller ratings. Compared to Q1 in FIG. 1, switches of the switch arrangement 224 in FIG. 4 have smaller ratings and are physically smaller. By including at least some components of an adaptive capacitive filter circuit 210B with an IC that also includes switching converter controller components as in the example embodiment of FIG. 4, the overall cost of a system that includes an adaptive capacitive filter circuit and a switching converter controller can be reduced relative to using multiple ICs for switching converter controller components and adaptive capacitive filter circuit components.

Figure 5:
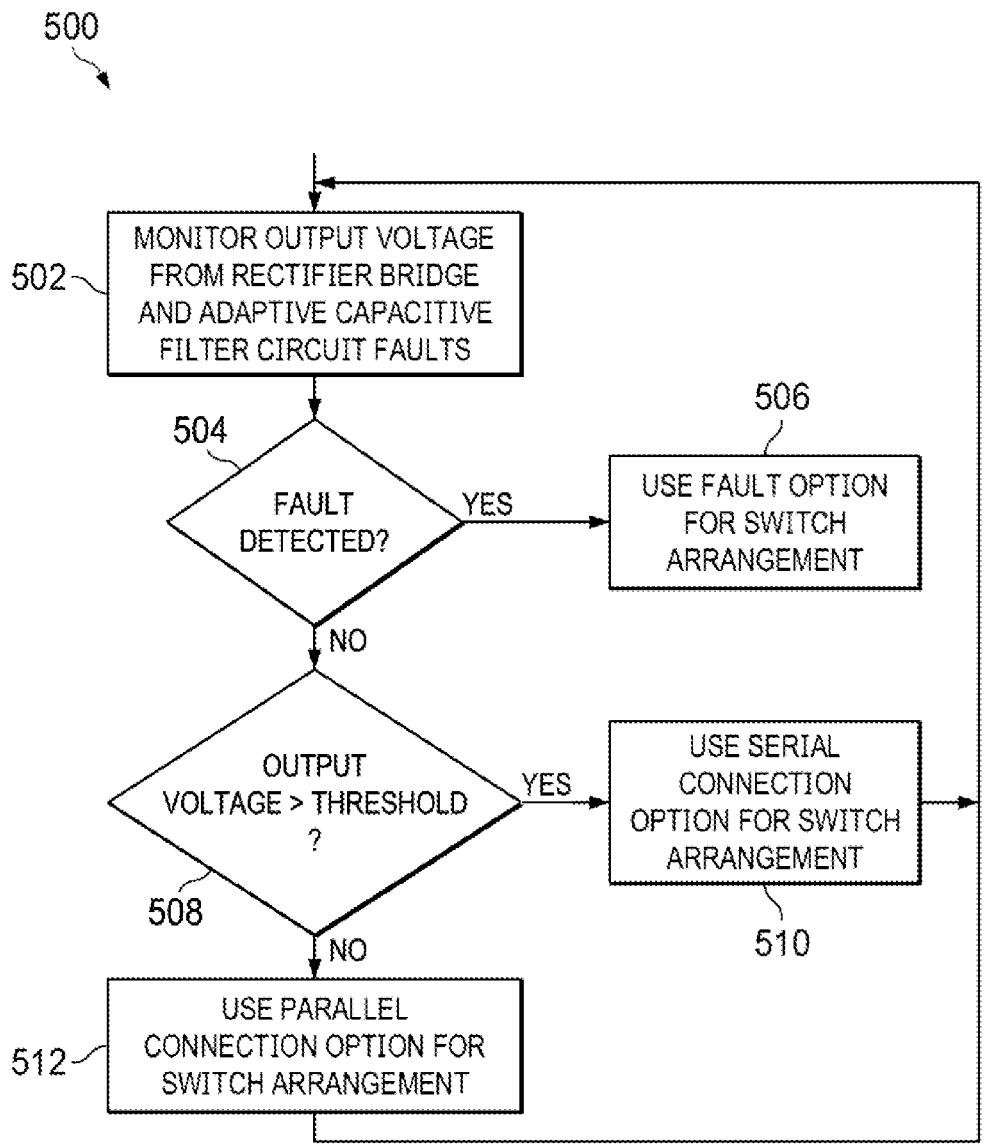
FIG. 5 is a flowchart of an adaptive capacitive filter circuit method in accordance with an example embodiment.

FIG. 5 is a flowchart of an adaptive capacitive filter circuit method 500 in accordance with an example embodiment. The method 500 is performed, for example, by the adaptive capacitive filter circuit 210 of FIG. 2, the adaptive capacitive filter circuit 210A of FIG. 3, or the adaptive capacitive filter circuit 210B of FIG. 4. As shown, the method 500 includes monitoring an output voltage (e.g., VOUT in FIGS. 2 and 3, or VOUT1 in FIG. 4) from a rectifier bridge and adaptive capacitive filter circuit faults at block 502. If a fault is detected (determination block 504), a fault option for a switch arrangement (e.g., the switch arrangement 224 in FIGS. 2 and 4, or related switches in FIG. 3) of the adaptive capacitive filter circuit is used at block 506. If a fault is not detected (determination block 504), the method 500 determines if the output voltage is greater than a threshold (determination block 508). If the output voltage is greater than the threshold (determination block 508), a serial connection option for the switch arrangement is used at block 510. If the output voltage is not greater than the threshold (determination block 508), a parallel connection option for the switch arrangement is used at block 512. The method 500 may be repeated as needed.

In some example embodiments, an adaptive capacitive filter circuit (e.g., adaptive capacitive filter circuit 210 in FIG. 2, the adaptive capacitive filter circuit 210A in FIG. 3, or the adaptive capacitive filter circuit 210B in FIG. 4) includes: a first adaptive capacitive filter circuit terminal (e.g., the first adaptive capacitive filter circuit terminals 212 in FIGS. 2-4) adapted to be coupled to a rectifier bridge output (e.g., the rectifier bridge output 206 in FIGS. 2-4); a second adaptive capacitive filter circuit terminal (e.g., the third rectifier bridge output terminal 216 in FIGS. 2-4) adapted to be coupled to ground; a first capacitor (e.g., a first capacitor of set of capacitors 218 in FIGS. 2 and 4, or C3 in FIG. 3) having a first electrode and a second electrode, the first electrode of the first capacitor coupled to the first adaptive capacitive filter circuit terminal; a second capacitor (e.g., a second capacitor of set of capacitors 218 in FIGS. 2 and 4, or C4 in FIG. 3) having a first electrode and a second electrode, the second electrode of the second capacitor coupled to the second adaptive capacitive filter circuit terminal; a first switch (e.g., a first switch of the switch arrangement 224 in FIGS. 2 and 4, or Q2 in FIG. 3) coupled between the second electrode of the first capacitor and the second adaptive capacitive filter circuit terminal; a second switch (e.g., a first second of the switch arrangement 224 in FIGS. 2 and 4, or Q3 in FIG. 3) coupled between the first adaptive capacitive filter circuit terminal and the first electrode of the second capacitor; and a third switch (e.g., a first third of the switch arrangement 224 in FIGS. 2 and 4, or Q4 in FIG. 3) coupled between the second electrode of the first capacitor and the first electrode of the second capacitor.

In some example embodiments, the adaptive capacitive filter circuit includes a control circuit (e.g., the control circuit 250 in FIGS. 2 and 4, or the control circuit 250A in FIG. 3) having a control circuit input (e.g., the control circuit input 252 in FIGS. 2-4) and a control circuit output (e.g., the control circuit output 254 in FIGS. 2-4), the control circuit input is adapted to be coupled to the first adaptive capacitive filter circuit terminal. The control circuit is configured to: receive an output voltage from the rectifier bridge output at the control circuit input; compare the output voltage with a threshold; and provide a control signal (e.g., CS1 in FIGS. 2-4) at the control circuit output responsive to the comparison. In some example embodiments, the control signal is a first control signal, and the adaptable capacitive filter circuit includes a fault sense circuit (e.g., the fault sense circuit 240 in FIGS. 2 and 4, or the fault sense circuit 240A in FIG. 3) having a fault sense circuit input (e.g., the fault sense circuit inputs 242 and 244 in FIG. 2, or the fault sense circuit inputs 310 in FIG. 3) and a fault sense circuit output (e.g., the fault sense circuit output 246 in FIG. 2). The fault sense circuit input is configured to receive a sense signal. The fault sense circuit is configured to provide a second control signal (e.g., CS2 in FIGS. 2-4) at the fault sense circuit output responsive to the sense signal. The second control signal indicates whether a fault condition exists for the adaptive capacitive filter circuit. In some example embodiments, the sense signal indicates a voltage across the first capacitor or the second capacitor, and the fault sense circuit is configured to: compare the voltage across the first capacitor or the second capacitor with a threshold; and provide the second control signal at the fault sense circuit output responsive to the comparison.

In some example embodiments, the adaptive capacitive filter circuit includes control logic (e.g., the control logic 320 in FIGS. 3 and 4) having a first control logic input (e.g., the first control logic input 322 in FIG. 3), a second control logic input (e.g., the second control logic input 324 in FIG. 3), and control logic outputs (e.g., the first and second control logic outputs 326 and 328 in FIG. 3). The first control logic input is coupled to the control circuit output. The second control logic input is coupled to the fault sense circuit output. The control logic outputs are coupled to control terminals of the first switch, the second switch, and the third switch.

In some example embodiments, the control logic of an adaptive capacitive filter circuit is configured to provide a set of switch drive signals at the control logic outputs responsive to the first control signal indicating the output voltage is greater than the threshold and the second control signal indicating absence of a fault condition. In such case, the set of switch drive signals includes a first switch drive signal to turn off the first switch, a second switch drive signal to turn off the second switch, and a third switch drive signal to turn on the third switch. In some example embodiments, the control logic is configured to provide a set of switch drive signals at the control logic outputs responsive to the first control signal indicating the output voltage is not greater than the threshold and the second control signal indicating absence of a fault condition. In such case, the set of switch drive signals includes a first switch drive signal to turn on the first switch, a second switch drive signal to turn on the second switch, and a third switch drive signal to turn off the third switch. In some example embodiments, the control logic is configured to provide a set of switch drive signals at the control logic outputs responsive to the second control signal indicating a fault condition exists. In such case, the set of switch drive signals including a first switch drive signal to turn on the first switch, a second switch drive signal to turn on the second switch, and a third switch drive signal to turn on the third switch.

In some example embodiments, the adaptive capacitive filter circuit includes control circuitry configured to: operate the first switch, the second switch, and the third switch to couple the first capacitor and the second capacitor in series between the first adaptive capacitive filter circuit terminal and the second adaptive capacitive filter circuit terminal responsive to an output voltage of the rectifier bridge output being greater than a threshold; and operate the first switch, the second switch, and the third switch to couple the first capacitor and the second capacitor in parallel between the first adaptive capacitive filter circuit terminal and the second adaptive capacitive filter circuit terminal responsive to the output voltage of the rectifier bridge output not being greater than the threshold. In some example embodiments, the control circuitry is configured to operate the first switch, the second switch, and the third switch to bypass the first capacitor and the second capacitor resulting in the first adaptive capacitive filter circuit terminal being coupled to ground responsive to a detected fault condition for the adaptive capacitive filter circuit.

In some example embodiments, an integrated circuit (e.g., the integrated circuit 402 in FIG. 4) includes control circuitry (e.g., the control circuit 250 in FIGS. 2 and 4, the control circuit 250A in FIG. 3, the fault sense circuit 240 in FIGS. 2 and 4, the fault sense circuit 240A in FIG. 3, and the control logic 320 in FIGS. 3 and 4) for an adaptive capacitive filter circuit. The control circuitry is configured to: detect whether an output voltage (e.g., VOUT in FIGS. 2 and 3, or VOUT1 in FIG. 4) at a rectifier bridge output is greater than a threshold (e.g., VREF in FIG. 3); responsive to detecting that the output voltage is greater than the threshold, provide a first set of switch drive signals for switches (e.g., the switch arrangement 224 in FIGS. 2 and 4, or Q2, Q3, and Q4 in FIG. 3) of the adaptive capacitive filter circuit to couple capacitors of the adaptive capacitive filter circuit in series; and responsive to detecting that the output voltage is not greater than the threshold, provide a second set of switch drive signals for switches of the adaptive capacitive filter circuit to couple the capacitors of the adaptive capacitive filter circuit in parallel.

In some example embodiments, the control circuitry is further configured to: detect whether a fault condition exists for the adaptive capacitive filter circuit; and responsive to detecting a fault condition, provide a third set of switch drive signals for switches of the adaptive capacitive filter circuit to bypass the capacitors of the adaptive capacitive filter circuit. In some example embodiments, the switches of the adaptive capacitive filter circuit are part of the integrated circuit, and the capacitors of the adaptive capacitive filter circuit are external to the integrated circuit.

In some example embodiment, the switches include a first switch (e.g., a first switch of the switch arrangement 224 in FIGS. 2 and 4, or Q2 in FIG. 3), a second switch (e.g., a second switch of the switch arrangement 224 in FIGS. 2 and 4, or Q3 in FIG. 3) and a third switch (e.g., a third switch of the switch arrangement 224 in FIGS. 2 and 4, or Q4 in FIG. 3), the capacitors include a first capacitor (e.g., a first capacitor of the set of capacitors 218 in FIGS. 2 and 4, or C3 in FIG. 3) and a second capacitor (e.g., a second capacitor of the set of capacitors 218 in FIGS. 2 and 4, or C4 in FIG. 3), and the integrated circuit includes: a first terminal (e.g., the first adaptive capacitive filter circuit terminal 212 in FIGS. 2-4) adapted to be coupled to the rectifier bridge output; a second terminal (e.g., the third adaptive capacitive filter circuit terminal 216 in FIGS. 2-4) adapted to be coupled to ground; a third terminal (e.g., the second terminal 332 in FIGS. 3 and 4) coupled to a current terminal of the first switch and a first current terminal of the third switch, the third terminal adapted to be coupled to an electrode of the first capacitor; and a fourth terminal (e.g., the second terminal 330 in FIGS. 3 and 4) coupled to a current terminal of the second switch and a second current terminal of the third switch, the fourth terminal adapted to be coupled to an electrode of the second capacitor. In some example embodiments, the integrated circuit includes switching converter controller components configured to control power switches (e.g., the power switch 414 in FIG. 4) of a power stage (e.g., the power stage 410 in FIG. 4) adapted to be coupled to the rectifier bridge output, the switching converter controller components including a control loop (e.g., the control loop 406 in FIG. 4) and a driver circuit (e.g., the driver circuit 408 in FIG. 4).

In some example embodiments, a system (e.g., the power management system 200 in FIG. 2, the power management system 300 in FIG. 3, or the system 400 in FIG. 4) includes an adaptive capacitive filter circuit having: a set of capacitors (e.g., the set of capacitors 218 FIGS. 2 and 4, or C3 and C4 in FIG. 3); a first adaptive capacitive filter circuit terminal (e.g., the first adaptive capacitive filter circuit terminal 212 in FIGS. 2-4) adapted to be coupled to a rectifier bridge output (e.g., the rectifier bridge output 206 in FIGS. 2-4); and a second adaptive capacitive filter circuit terminal (e.g., the third adaptive capacitive filter circuit terminal 216 in FIGS. 2-4) adapted to be coupled to ground. The adaptive capacitive filter circuit is configured to connect capacitors of the set of capacitors in series or in parallel between the first adaptive capacitive filter circuit terminal and the second adaptive capacitive filter circuit terminal responsive to a control signal (e.g., CS1 in FIGS. 2-4).

In some example embodiments, the adaptive capacitive filter circuit includes control circuitry (e.g., the control circuit 250 in FIGS. 2 and 4, the control circuit 250A in FIG. 3, the fault sense circuit 240 in FIGS. 2 and 4, the fault sense circuit 240A in FIG. 3, and the control logic 320 in FIGS. 3 and 4) and a switch arrangement (e.g., the switch arrangement 224 in FIGS. 2 and 4, or Q2, Q3, and Q4 in FIG. 3) controlled by the control circuitry. The control circuitry is configured to: provide the control signal responsive to a comparison of an output voltage (e.g., VOUT in FIGS. 2 and 3, or VOUT1 in FIG. 4) at the rectifier bridge output with a threshold (e.g., VREF in FIG. 3); responsive to the control signal indicating that the output voltage is greater than the threshold, provide a first set of switch drive signals to the switch arrangement to couple capacitors of the set of capacitors in series; and responsive to the control signal indicating that the output voltage is not greater than the threshold, provide a second set of switch drive signals to the switch arrangement to couple the capacitors of the set of capacitors in parallel.

In some example embodiments, the control signal is a first control signal, and the control circuitry is configured to: provide a second control signal (e.g., CS2 in FIGS. 2-4) responsive to a comparison of a sense signal related to a capacitor of the set of capacitors with a threshold; and responsive to the second control signal indicating a fault condition, provide a third set of switch drive signals for switches of the adaptive capacitive filter circuit to bypass the capacitors of the adaptive capacitive filter circuit.

In some example embodiments, the switch arrangement includes: a first switch (e.g., a first switch of the switch arrangement 224 in FIGS. 2 and 4, or Q2 in FIG. 3) coupled between a first capacitor (e.g., C3 in FIG. 3) of the set of capacitors and ground; a second switch (e.g., a second switch of the switch arrangement 224 in FIGS. 2 and 4, or Q3 in FIG. 3) coupled between the first adaptive capacitive filter circuit terminal and a second capacitor (e.g., C4 in FIG. 3) of the set of capacitors; and a third switch (e.g., a third switch of the switch arrangement 224 in FIGS. 2 and 4, or Q4 in FIG. 3) coupled between the first capacitor and the second capacitor. In some example embodiments, the system includes: a power stage (e.g., the power stage 410 in FIG. 4) adapted to be coupled to the rectifier bridge output; and a switching converter controller (e.g., the control loop 406 and the driver circuit 408 in FIG. 4) coupled to the power stage and configured to provide power switch drive signals (e.g., HS_CS and LS_CS in FIG. 4) to the power stage, wherein the switching converter controller, the control circuitry, and the switch arrangement are part of an IC (e.g., the IC 402 in FIG. 4).

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

As used herein, the terms "terminal," "electrode," "node," "interconnection," "pin," "contact," and "connection" are used interchangeably. Unless specifically stated to the contrary, these terms are generally used to mean an interconnection between or a terminus of a device element, a circuit element, an IC, a device or other electronics or semiconductor component.

The example embodiments above may use switches in the form of n-type metal-oxide semiconductor field-effect transistors ("NFETs") or p-type metal-oxide semiconductor field-effect transistors ("PFETs"). Other example embodiments may utilize NPN bipolar junction transistors (BJTs), PNP BJTs, or any other type of transistor. Accordingly, when referring to a current electrode, such electrode may be an emitter, collector, source or drain. Also, the control electrode may be a base or a gate.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or IC package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available before the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in this description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value.

Modifications are possible in the described embodiments, and other embodiments are possible, within the scope of the claims.

What is claimed is:

1. An adaptive capacitive filter circuit comprising:
   a first adaptive capacitive filter circuit terminal adapted to be coupled to a rectifier bridge output;
   a second adaptive capacitive filter circuit terminal adapted to be coupled to a ground terminal;
   a first capacitor having a first electrode and a second electrode, the first electrode of the first capacitor coupled to the first adaptive capacitive filter circuit terminal;
   a second capacitor having a first electrode and a second electrode, the second electrode of the second capacitor coupled to the second adaptive capacitive filter circuit terminal;
   a first switch coupled between the second electrode of the first capacitor and the second adaptive capacitive filter circuit terminal;
   a second switch coupled between the first adaptive capacitive filter circuit terminal and the first electrode of the second capacitor;
   a third switch coupled between the second electrode of the first capacitor and the first electrode of the second capacitor; and
   a fault sense circuit having a fault sense circuit input and a fault sense circuit output, wherein:
      the fault sense circuit input is coupled to a sense signal associated with one of the first capacitor, the second capacitor, the first switch, the second switch, and the third switch;
      the fault sense circuit is configured to detect a fault condition based on the sense signal;
      the fault sense circuit is coupled to a control circuit; and
      responsive to detecting a fault condition, the control circuit is configured to close the first switch, the second switch, and the third switch.

2. The adaptive capacitive filter circuit of claim 1, wherein the adaptive capacitive filter circuit is coupled to the control circuit having a control circuit input and a control circuit output, the control circuit input is adapted to be coupled to the first adaptive capacitive filter circuit terminal, and the control circuit is configured to:
   receive an output voltage from the rectifier bridge output at the control circuit input;
   compare the output voltage with a threshold to determine a comparison; and
   provide a control signal at the control circuit output responsive to the comparison.

3. The adaptive capacitive filter circuit of claim 2, wherein:
   the control signal is a first control signal;
   the fault sense circuit is configured to provide a second control signal at the fault sense circuit output responsive to the sense signal; and
   the second control signal indicates whether a fault condition exists for the adaptive capacitive filter circuit.

4. The adaptive capacitive filter circuit of claim 3, wherein the sense signal indicates a voltage across the first capacitor or the second capacitor, and the fault sense circuit is configured to:
   compare the voltage across the first capacitor or the second capacitor with a threshold; and
   provide the second control signal at the fault sense circuit output responsive to the comparison.

5. The adaptive capacitive filter circuit of claim 3, further comprising control logic having a first control logic input, a second control logic input, and control logic outputs, the first control logic input is coupled to the control circuit output, the second control logic input is coupled to the fault sense circuit output, and the control logic outputs are coupled to control terminals of the first switch, the second switch, and the third switch.

6. The adaptive capacitive filter circuit of claim 5, wherein the control logic is configured to provide a set of switch drive signals at the control logic outputs responsive to the first control signal indicating the output voltage is greater than the threshold and the second control signal indicating absence of a fault condition, the set of switch drive signals including a first switch drive signal to turn off the first switch, a second switch drive signal to turn off the second switch, and a third switch drive signal to turn on the third switch.

7. The adaptive capacitive filter circuit of claim 5, wherein the control logic is configured to provide a set of switch drive signals at the control logic outputs responsive to the first control signal indicating the output voltage is not greater than the threshold and the second control signal indicating absence of a fault condition, the set of switch drive signals including a first switch drive signal to turn on the first switch, a second switch drive signal to turn on the second switch, and a third switch drive signal to turn off the third switch.

8. The adaptive capacitive filter circuit of claim 5, wherein the control logic is configured to provide a set of switch drive signals at the control logic outputs responsive to the second control signal indicating a fault condition, the set of switch drive signals including a first switch drive signal to turn on the first switch, a second switch drive signal to turn on the second switch, and a third switch drive signal to turn on the third switch.

9. The adaptive capacitive filter circuit of claim 1, further comprising control circuitry configured to:
operate the first switch, the second switch, and the third switch to couple the first capacitor and the second capacitor in series between the first adaptive capacitive filter circuit terminal and the second adaptive capacitive filter circuit terminal responsive to an output voltage of the rectifier bridge output being greater than a threshold; and
operate the first switch, the second switch, and the third switch to couple the first capacitor and the second capacitor in parallel between the first adaptive capacitive filter circuit terminal and the second adaptive capacitive filter circuit terminal responsive to the output voltage of the rectifier bridge output not being greater than the threshold.

10. The adaptive capacitive filter circuit of claim 9, wherein the control circuitry is configured to operate the first switch, the second switch, and the third switch to bypass the first capacitor and the second capacitor resulting in the first adaptive capacitive filter circuit terminal being coupled to the ground terminal responsive to a detected fault condition for the adaptive capacitive filter circuit.

11. An integrated circuit comprising:
control circuitry for an adaptive capacitive filter circuit, the control circuitry is configured to:
detect whether an output voltage at a rectifier bridge output is greater than a threshold;
responsive to detecting that the output voltage is greater than the threshold, provide a first set of switch drive signals for switches of the adaptive capacitive filter circuit to couple capacitors of the adaptive capacitive filter circuit in series;
responsive to detecting that the output voltage is not greater than the threshold, provide a second set of switch drive signals for switches of the adaptive capacitive filter circuit to couple the capacitors of the adaptive capacitive filter circuit in parallel;
detect whether a fault condition exists for the adaptive capacitive filter circuit; and
responsive to detecting a fault condition, provide a third set of switch drive signals for switches of the adaptive capacitive filter circuit to bypass the capacitors of the adaptive capacitive filter circuit.

12. The integrated circuit of claim 11, wherein the switches of the adaptive capacitive filter circuit are part of the integrated circuit, and the capacitors of the adaptive capacitive filter circuit are external to the integrated circuit.

13. The integrated circuit of claim 12, wherein the switches include a first switch, a second switch and a third switch, the capacitors include a first capacitor and a second capacitor, and the integrated circuit further comprises:
a first terminal adapted to be coupled to the rectifier bridge output;
a second terminal adapted to be coupled to a ground terminal;
a third terminal coupled to a current terminal of the first switch and a first current terminal of the third switch, the third terminal adapted to be coupled to an electrode of the first capacitor; and
a fourth terminal coupled to a current terminal of the second switch and a second current terminal of the third switch, the fourth terminal adapted to be coupled to an electrode of the second capacitor.

14. The integrated circuit of claim 11, further comprising switching converter controller components configured to control power switches of a power stage adapted to be coupled to the rectifier bridge output, the switching converter controller components including a control loop and a driver circuit.

15. A system comprising:
an adaptive capacitive filter circuit having:
a set of capacitors;
a first adaptive capacitive filter circuit terminal adapted to be coupled to a rectifier bridge output; and
a second adaptive capacitive filter circuit terminal adapted to be coupled to a ground terminal, wherein:
the adaptive capacitive filter circuit is configured to connect capacitors of the set of capacitors in series or in parallel between the first adaptive capacitive filter circuit terminal and the second adaptive capacitive filter circuit terminal responsive to a first control signal and a second control signal, wherein the first control signal is based on a comparison of a sense signal associated with a capacitor of the set of capacitors with a threshold, and the second control signal is associated with a fault condition of the adaptive capacitive filter, wherein in response to the fault condition existing, the adaptive capacitive filter circuit is configured to bypass the capacitors; and
the adaptive capacitive filter circuit is configured to detect the fault condition.

16. The system of claim 15, wherein the adaptive capacitive filter circuit includes control circuitry and a switch arrangement controlled by the control circuitry, the control circuitry configured to:
provide the first control signal responsive to a comparison of an output voltage at the rectifier bridge output with a threshold;
responsive to the first control signal indicating that the output voltage is greater than the threshold, provide a first set of switch drive signals to the switch arrangement to couple capacitors of the set of capacitors in series; and responsive to the first control signal indicating that the output voltage is not greater than the threshold, provide a second set of switch drive signals to the switch arrangement to couple the capacitors of the set of capacitors in parallel.

17. The system of claim 16, wherein the switch arrangement includes:
   a first switch coupled between a first capacitor of the set of capacitors and the ground terminal;
   a second switch coupled between the first adaptive capacitive filter circuit terminal and a second capacitor of the set of capacitors; and
   a third switch coupled between the first capacitor and the second capacitor.

18. The system of claim 17, further comprising:
   a power stage adapted to be coupled to the rectifier bridge output; and
   a switching converter controller coupled to the power stage and configured to provide power switch drive signals to the power stage, wherein the switching converter controller, the control circuitry, and the switch arrangement are part of an integrated circuit.

* * * * *